(12) United States Patent
Yamazaki

(10) Patent No.: US 7,053,545 B2
(45) Date of Patent: May 30, 2006

(54) LIGHT-EMITTING DEVICE AND METHOD OF MANUFACTURING THE SAME

(75) Inventor: Shunpei Yamazaki, Tokyo (JP)

(73) Assignee: Semiconductor Energy Laboratory Co., Ltd., Agsugi (JP)

( * ) Notice: Subject to any disclaimer, the term of this patent is extended or adjusted under 35 U.S.C. 154(b) by 0 days.

(21) Appl. No.: 10/460,633

(22) Filed: Jun. 13, 2003

(65) Prior Publication Data

US 2003/0209974 A1 Nov. 13, 2003

Related U.S. Application Data

(62) Division of application No. 09/771,927, filed on Jan. 30, 2001, now Pat. No. 6,580,213.

(30) Foreign Application Priority Data

Jan. 31, 2000 (JP) ............... 2000-021210

(51) Int. Cl.
*H05B 33/00* (2006.01)
*H05B 33/14* (2006.01)

(52) U.S. Cl. ............ 313/504; 313/503; 313/506; 313/509; 428/490

(58) Field of Classification Search ........ 428/690, 428/66, 704, 917; 313/498, 502, 504, 506; 257/94

See application file for complete search history.

(56) References Cited

U.S. PATENT DOCUMENTS

| | | | |
|---|---|---|---|
| 5,120,671 A | * | 6/1992 | Tang et al. ............ 438/257 |
| 5,247,190 A | | 9/1993 | Friend et al. |
| 5,343,050 A | | 8/1994 | Egusa et al. |
| 5,399,502 A | | 3/1995 | Friend et al. |
| 5,536,949 A | | 7/1996 | Hosokawa et al. |
| 5,550,066 A | * | 8/1996 | Tang et al. ............ 438/29 |
| 5,703,436 A | | 12/1997 | Forrest et al. |
| 6,312,836 B1 | | 11/2001 | Bulovic et al. |
| 6,524,727 B1 | * | 2/2003 | Kathirgamanathan ....... 428/690 |
| 6,580,213 B1 | * | 6/2003 | Yamazaki ............ 313/506 |

FOREIGN PATENT DOCUMENTS

| WO | WO 90/13148 | 11/1990 |
|---|---|---|
| WO | WO 94/06157 | 3/1994 |

OTHER PUBLICATIONS

Kido et al., "Multilayer White Light-Emitting Organic Electroluminescent Device", Science 267, Mar. 1, 1995, pp. 1332-1334.*

(Continued)

*Primary Examiner*—Mariceli Santiago
(74) *Attorney, Agent, or Firm*—Fish & Richardson P.C.

(57) ABSTRACT

The present invention has an object to provide a method of raising a re-coupling efficiency of carriers in an EL element to thereby provide a light-emitting device having high emission efficiency. The method is that the electron trap region 106 and the hole trap region 107 are formed in the interior of the emission layer 103. The electron trap region 106 here is a region that has the action of enclosing within the emission layer an electrons that is transferred at the lowest unoccupied molecular orbit (LUMO) level of the emission layer 103. In addition, the hole trap region 107 is a region that has the action of enclosing within the emission layer a hole that is transferred at the highest occupied molecular orbit (HOMO) level of the emission layer 103.

28 Claims, 8 Drawing Sheets

OTHER PUBLICATIONS

Yoshida et al., "Three-layered multicolor organic electroluminescent device", Appl. Phys. Lett. 69 (6), Aug. 5, 1996, pp. 734-736.*

Herman Schenk et al., "Polymers for Light Emitting Diodes", EuroDisplay '99 Proceedings, pp. 33-37; Sep. 6-9, 1999.

Japanese Patent Application Laid-Open No. 10-092576 (English Abstract attached).

Herman Schenk et al., "Polymers for Light Emitting Diodes", EuroDisplay '99 Proceedings, pp. 33-37; Sep. 6-9, 1999.

* cited by examiner

<prior art>

LIGHT-EMITTING DEVICE AND METHOD OF MANUFACTURING THE SAME

CROSS-REFERENCE TO RELATED APPLICATIONS

This application is a divisional application of U.S. application Ser. No. 09/771,927, filed on Jan. 30, 2001 now U.S. Pat. No. 6,580,213, issued Jun. 13, 2003, which claims the benefit of a foreign priority application filed in Japan, Serial No. 2000-021210, filed Jan. 31, 2000, both of which are incorporated by reference.

BACKGROUND OF THE INVENTION

1. Field of the Invention

The present invention relates to a light-emitting device that uses a luminous organic film. Further, the present invention relates to electric equipment using the light-emitting device as a display portion or a light source. It is to be noted that the luminous organic film, which can be used in the present invention, includes all organic films that emit light (fluorescent light and/or phosphorescent light) via either a singlet excitation or a triplet excitation, or via both excitations.

2. Description of the Related Art

In recent years, development is proceeding in a light-emitting device (hereinafter referred to as an EL light-emitting device) employing a luminous element (hereinafter referred to as an EL element) that uses a luminous organic film (hereinafter referred to as an organic EL film) that provides EL (Electro Luminescence). The EL light-emitting device has an EL element that is composed of an anode, a cathode, and an organic EL film sandwiched therebetween. The emission of light can be attained by applying a voltage between the anode and the cathode.

At this point, a hole from the anode is injected into the EL material, and an electron from the cathode is injected therein. Electric charges (carriers) injected from both the electrodes move in the interior of the organic EL film to thereby re-couple. An excitation state is generated by the re-coupling of the carriers, and a portion thereof is converted into photons. Luminescence can be made visible by extracting these photons to the outside.

Such a conventional light-emitting mechanism of the EL element is shown in FIGS. 2A and 2B. Shown in FIG. 2A is the conventional junction structure of the EL element in which reference symbol 201 denotes a cathode, reference symbol 202 denotes an electron transfer layer, reference symbol 203 denotes an emission layer, reference symbol 204 denotes a hole transfer layer, and reference symbol 205 denotes an anode. Further, shown in FIG. 2B is the carrier injection process thereof. A voltage is applied between the cathode 201 and the anode 205 to thereby inject an electron 206 and a hole 207. The injected electron 206 and hole 207 re-couple, whereby an emission 208 is attained.

Taking into consideration such a light-emitting mechanism, the efficiency of light emitted from the EL element, that is, the emission efficiency (expressed as η (emission)) is expressed as the following equation.

η(emission)=η(injection)×η(re-coupling)×η(excitation)×η(quantum)

Here in this equation, η (injection) denotes the efficiency when the carrier is injected from the electrode, η (re-coupling) denotes the re-coupling efficiency of the electron and the hole, η (excitation) denotes the efficiency of generating a singlet exciton due to the re-coupling, and η (quantum) denotes the efficiency of converting the singlet exciton to a photon.

The η (injection) efficiency originates in an electric potential barrier in the interface between the cathode (or the anode) and the EL material, and changes. The lower the electric potential barrier, the higher the η (injection) efficiency is. The η (re-coupling) efficiency changes due to the injection balance of the carrier (balance of the ratio of the injected electron and hole), and is influenced by the carrier transfer characteristic of the emission layer (the organic EL film that will actually emit light). Further, the η (excitation) efficiency is the generating efficiency of the singlet exciton that contributes to the emission of light, and is theoretically set (fixed) at about 0.25. Further, the change of the η (quantum) efficiency depends on whether the emission layer is crystalline or non-crystalline. Generally speaking a higher value can be attained from a crystalline emission layer than from a non-crystalline one.

In addition, until the photons, which are generated in the emission layer, are extracted to the outside, most of them are lost (about 80% are lost) due to diffusion and thermal deactivation. Therefore, light that is actually observed includes the loss of the photons. Thus, in the light-emitting mechanism process of the EL element, the emission efficiency is reduced due to various factors. In order to obtain high emission efficiency, the above-mentioned various efficiencies have to be raised to thereby attain a total high emission efficiency.

SUMMARY OF THE INVENTION

The present invention has been made in view of the above, and therefore has an object to provide a method of raising a re-coupling efficiency of carriers in an EL element to thereby provide a light-emitting device having high emission efficiency. Further, another object of the present invention is to provide electric equipment using the light-emitting device as a display portion or a light source.

In the present invention, attention is paid to the band structure of the EL element in order to improve the re-coupling efficiency (expressed as η (re-coupling)) of an electron and a hole, and it is characterized in that the probability of the re-coupling is increased by enclosing the electron and the hole in a specific region to thereby enhance the re-coupling efficiency thereof. Therefore, the EL element having the band structure shown in FIG. 1A is formed.

In FIG. 1A, reference symbol 101 denotes a cathode, reference symbol 102 denotes an electron transfer layer, reference symbol 103 denotes an emission layer, reference symbol 104 denotes a hole transfer layer, and reference symbol 105 denotes an anode. Further, an electron trap region 106 and a hole trap region 107 are formed in the interior of the emission layer 103. It is to be noted that the structure of the EL element may be a structure provided with either the electron trap region 106 or the hole trap region 107.

The electron trap region 106 here is a region that has the action of enclosing within the emission layer an electron that is transferred at the lowest unoccupied molecular orbit (LUMO) level of the emission layer 103. In addition, the electron trap region 106 denotes a region that indicates a LUMO level that is lower than the LUMO level of the emission layer 103. The hole trap region 107 is a region that has the action of enclosing within the emission layer a hole that is transferred at the highest occupied molecular orbit (HOMO) level of the emission layer 103, and denotes a region that indicates a HOMO level that is higher than the HOMO level of the emission layer 103.

The electron trap region 106 can be formed by constructing a structure in which an organic film or a cluster of organic substances, which has the effect of lowering the LUMO level, is sandwiched between the emission layer 103. Further, the hole trap region 107 can be formed by constructing a structure in which an organic film or a cluster of organic substances, which has the effect of raising the HOMO level, is sandwiched between the emission layer 103.

Simultaneously with the provision of the above electron trap region 106 or the hole trap region 107, a hole prevention layer may be provided between the electron transfer layer 102 and the emission layer 103, or an electron prevention layer may be provided between the emission layer 103 and the hole transfer layer 104. Of course, the structure thereof may be a structure that is provided with both the hole prevention layer and the electron prevention layer.

If the band structure of the EL element shown in FIG. 1A is applied, then the carrier injection process thereof is a process as shown in FIG. 1B. In other words, an electron 108 transferred at the LUMO level is enclosed in the electron trap region 106 that is provided in the interior of the emission layer 103. On the other hand, a hole 109 transferred at the HOMO level is enclosed in the hole trap region 107. As a result, the re-coupling of the electron 108 and the hole 109 occurs between the electron trap region 106 and the hole trap region 107, whereby the emission of light can be obtained.

At this point, in the present invention, because re-coupling takes place under the state where either the electron or the hole is enclosed in the trap region, the re-coupling efficiency ($\eta$ (re-coupling)) can be improved more in comparison with a conventional one. It can be said that the concept of forming a level well in the interior of the emission layer to enclose carriers is an unprecedented concept.

Thus, among some parameters which contributes to the emission efficiency, the efficiency ($\eta$ (re-coupling)) that originates from the re-coupling of carriers can be improved by implementing the present invention, whereby the emission efficiency of the EL element is enhanced. Therefore, the driving voltage of the EL element can be set at a low rate even for attaining a luminance equivalent to that of the prior art, so that the consumption power of the light-emitting device can be reduced. In addition, the lowering of the driving voltage leads to the suppression of the deterioration of the organic EL film, resulting in the enhancement of the reliability of the light-emitting device.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Figure 1A:
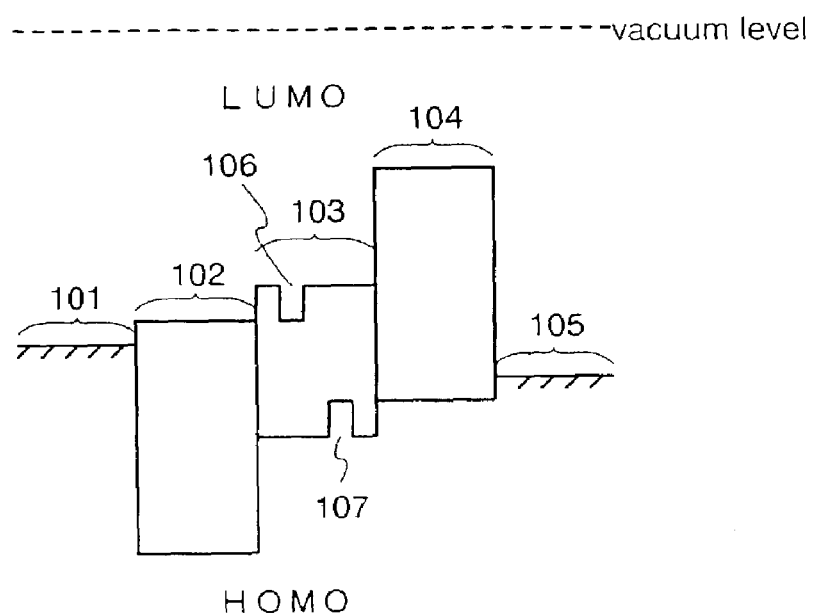
FIGS. 1A and 1B are diagrams showing a band structure of an EL element.
Figure 1B:
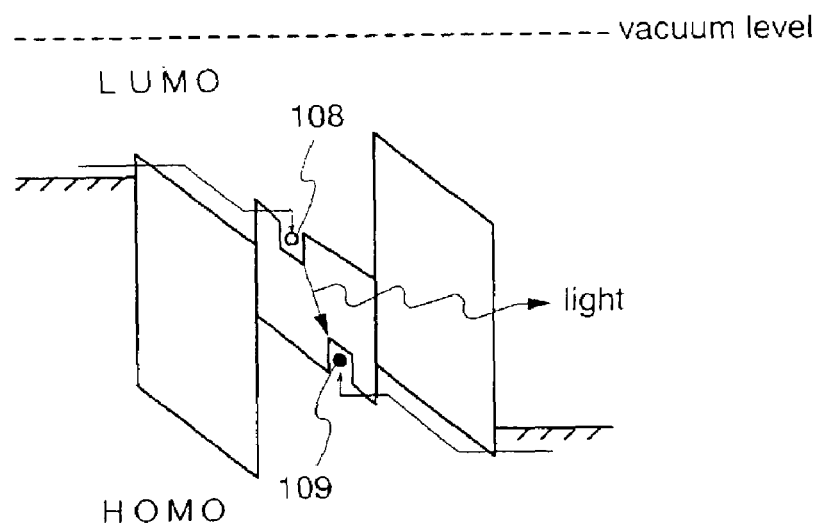
Figure 2A:
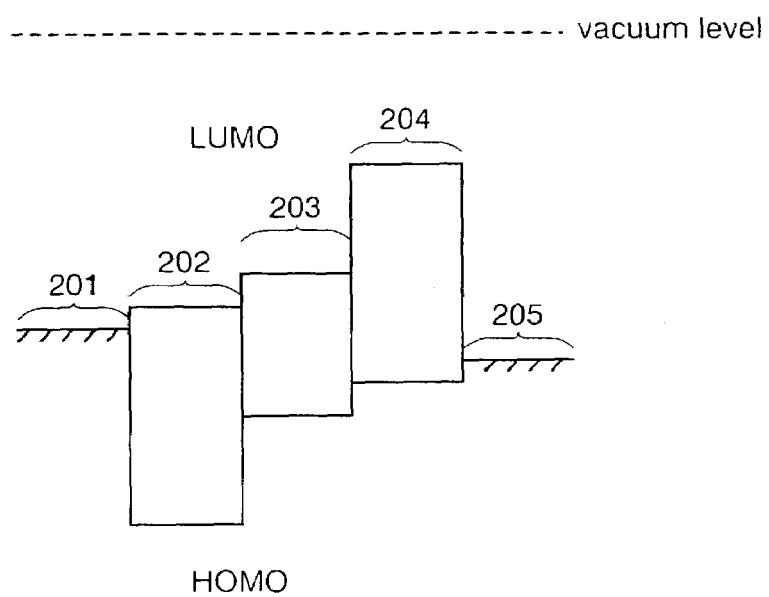
FIGS. 2A and 2B are diagrams showing a band structure of an EL element.
Figure 2B:
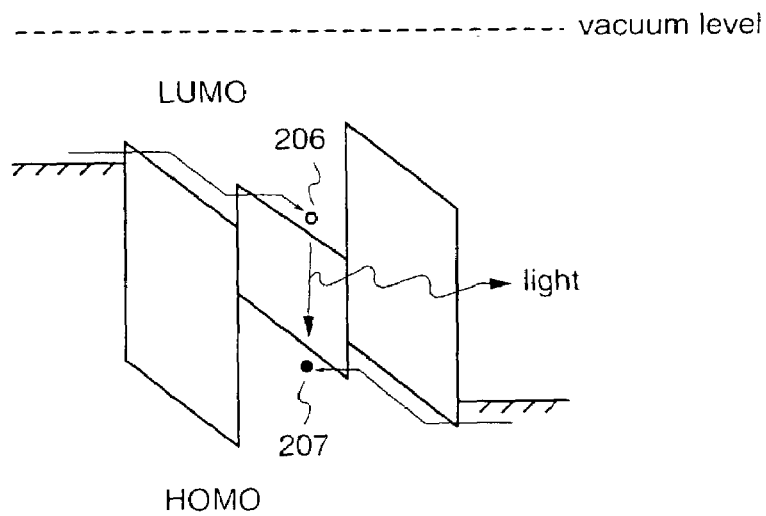
Figure 3A:
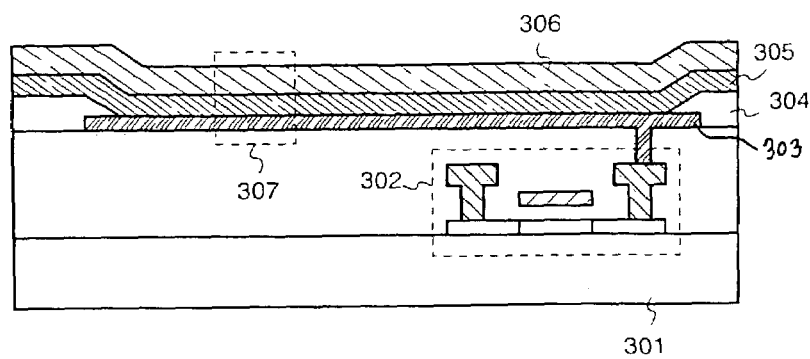
FIGS. 3A and 3B are diagrams showing a pixel of an EL light-emitting device and a cross-sectional structure of an EL element thereof, respectively.
Figure 3B:
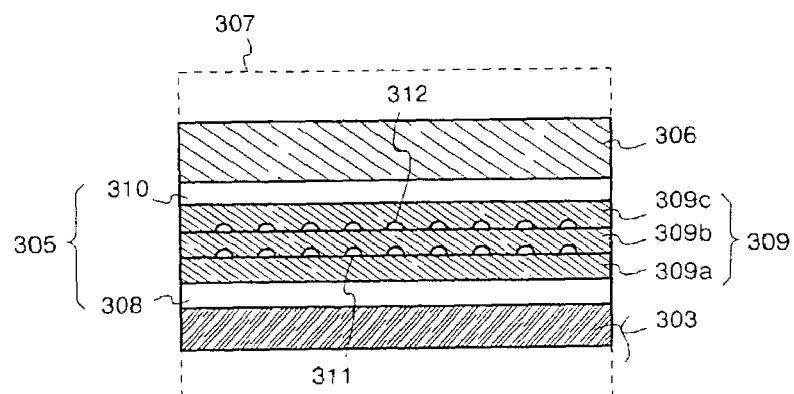

In an embodiment mode of the present invention, an explanation will be on a structure of an EL element for obtaining a band structure that is shown in FIG. 1A with reference to FIGS. 3A and 3B. Shown in FIG. 3A is a diagram schematically showing a cross-sectional structure of a pixel of an active matrix light-emitting device.

In FIG. 3A, reference symbol 301 denotes a substrate, reference symbol 302 denotes a TFT (thin film transistor), and reference symbol 303 denotes a pixel electrode that functions as an anode of the EL element. A glass substrate or a plastic substrate (includes plastic films) may be used as the substrate 301. Further, any TFT structure may be used to form the TFT 302, and a planar type TFT or a stagger type TFT can be used. As for the pixel electrode 303, a transparent conductive film having a large work function, typically a compound film of indium oxide and tin oxide or a compound film of indium oxide and zinc oxide, may be used.

Next, reference symbol 304 denotes an insulating film formed such that the EL material is not formed in a step of the pixel electrode. An insulating film containing silicon (silicon oxide film, silicon nitride oxide film, or a silicon nitride film) or an organic resin film may be used as the insulating film 304.

Further, a single layer or a lamination layer of an organic EL film may be used for an organic EL layer 305. That is, a single layer of an organic EL film may be used as the emission layer. Alternatively, the emission layer may be a lamination structure in which various organic films are combined, making it possible to make the laminated layers function as the layers which are a hole transfer layer (including a hole injection layer), a hole prevention layer, an emission layer, an electron prevention layer, and an electron transfer layer (including an electron injecting layer), respectively.

As for a cathode 306, a material that has a small work function is preferably used, and also, a material containing an element that belongs to Group 1 or Group 2 of the periodic table is used. Typically, an alloy film of aluminum and lithium and an alloy film of magnesium and silver may be used. Of course, other conductive films of any combination may be used.

An enlarged structure of a region denoted by reference symbol 307 in FIG. 3A is shown in FIG. 3B here. In the embodiment mode of the present invention, the organic EL layer 305 is composed of a hole transfer layer 308, an emission layer 309, and an electron transfer layer 310. Furthermore, the emission layer 309 is a three-layered structure composed of an emission layer 309a, an emission layer 309b, and an emission layer 309c. Of course, the emission layer 309a, the emission layer 309b, and the emission layer 309c are all made of the same organic EL film. In addition, a cluster of organic substances 311 is formed in the interface of the emission layer 309a and the emission layer 309b, and a cluster of organic substances 312 is formed in the interface of the emission layer 309b and the emission layer 309c.

Here, the cluster of organic substances 311 forms a hole trap region and the cluster of organic substances 312 forms an electron trap region. However, it is possible that the cluster of organic substances 311 forms the electron trap region and the cluster of organic substances 312 forms the hole trap region by changing the materials thereof.

The organic EL layer 305 shown here may be formed by evaporation, application (spin coating, dipping, LB method, or knife-edge method), or printing. However, it is desirable that the clusters of organic substances 311 and 312 are formed by evaporation. The cluster of organic substances may be provided regularly or irregularly. Further, the shape of the cluster of organic substances may be a granular or a flat board-like shape. The present invention is of course not limited to the above film deposition method, and any film deposition method may be used as long as the structure of FIG. 3B is formed.

In an EL element that has an organic EL layer composed of a structure as in the embodiment mode, the hole injected from the anode 304 is trapped by the cluster of organic substances 311, and the electron injected from the cathode 306 is trapped by the cluster of organic substances 312. The reason for this resides in that the HOMO level has become higher in the cluster of organic substances 311 and that the LUMO level has become lower in the cluster of organic substances 312.

Therefore, the electron and the hole enclosed in a locally potential (energy level) well re-couple at a high efficiency, thereby improving the emission efficiency of the entire EL elements. As a result, a light-emitting device having a low consumption power and high reliability can be achieved.

Note that a fluorescent substance may be doped into the emission layer 309 to thereby move the luminescent center to the fluorescent substance. Further, in the case of emitting color lights, three kinds of emission layers for the colors R (red), G (green), and B (blue) may be formed in line in each of the pixels, or an emission layer luminescing white color in combination with a color filter may be provided. In addition, a color converting layer (CCM) and a color filter may be combined with the emission layer luminescing blue color. A technique called the photo bleaching method (a technique that utilizes a phenomenon in which a fluorescent pigment deteriorates due to light irradiation) may also be used.

Although an example of an active matrix light-emitting device having the TFTs and the EL elements electrically connected is given in the embodiment mode, the present invention can be implemented in a passive matrix light-emitting device. Further, the present invention may be used a light source serving as a back light of a liquid crystal display or a back light of a fluorescent display lamp.

Embodiment 1

Figure 4:
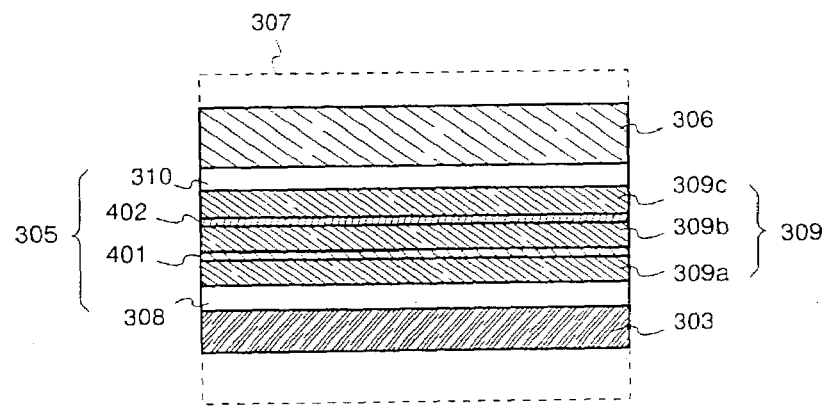
FIG. 4 is a diagram showing a cross-sectional structure of all EL element.

In Embodiment 1, an example of a case of using an organic film as a substitute for the clusters of organic substances 311 and 312 shown in FIG. 3B will be illustrated in FIG. 4. It is to be noted that the structure of the light-emitting device is similar to that of FIG. 3A.

Embodiment 1 is characterized in the structure such that an organic film 401 that has the effect of reducing the LUMO level is provided in order to form an election trap region or an organic film 402 that has the effect of raising the HOMO level is provided in order to form a hole trap region. Both the organic films 401 and 402 may be provided or either one may be provided. Further, the film thickness of the organic films 401 and 402 may be formed to between 10 and 50 nm (preferably between 20 and 30 nm).

In the case of adopting the structure of Embodiment 1, the hole is trapped in the organic film 401 and the electron is trapped in the organic film 402, whereby the re-coupling efficiency can be improved and the driving voltage of the EL elements can be reduced. In other words, a highly reliable light-emitting device having a low consumption power can be attained.

Embodiment 2

In the structure shown in FIG. 3B, the cluster of organic substances 311 serving as the hole trap region is provided on the side of the anode 303, and the cluster of organic substances 312 serving as the electron trap region is provided on the side of the cathode 306. However, the provision thereof may be inverted. That is, the structure may be such that the cluster of organic substances 311 serving as the hole trap region is provided on the side of the cathode 306, and the cluster of organic substances 312 serving as the electron trap region is provided on the side of the anode 303.

Similarly, in the structure shown in FIG. 4, the structure may have the provision of an organic film 401 that serves as the hole trap region on the side of the cathode 306 and the provision of an organic film 402 that serves as the electron trap region on the side of the anode 303.

Embodiment 3

In Embodiment 3, an explanation will be made on a light-emitting device employing an EL element that has a band structure different from that of FIG. 1A with reference to FIGS. 5A and 5B. It is to be noted that an emission layer 500 is the only component in FIG. 5A that is different from FIG. 1A, and therefore the same reference symbols will be used for the other components.

Figure 5A:
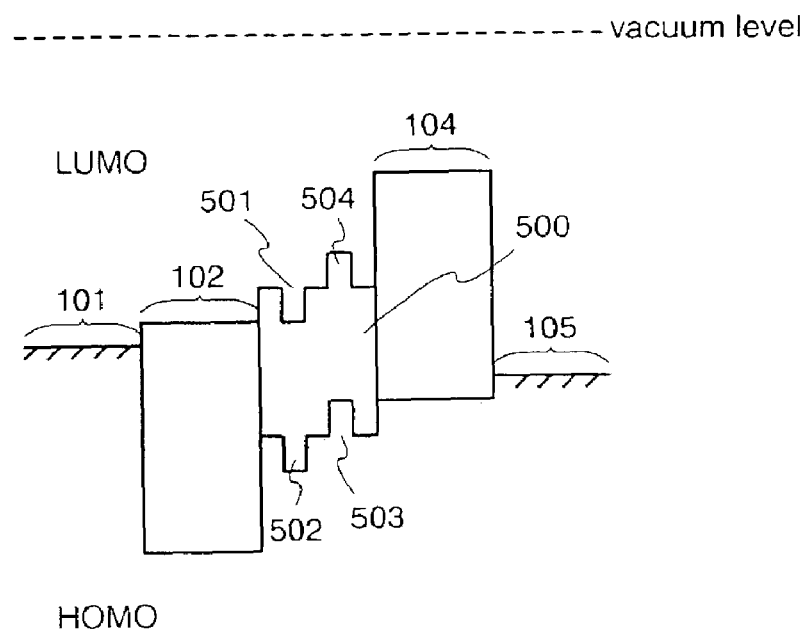
FIGS. 5A and 5B are diagrams showing a band structure of an EL element.
Figure 5B:
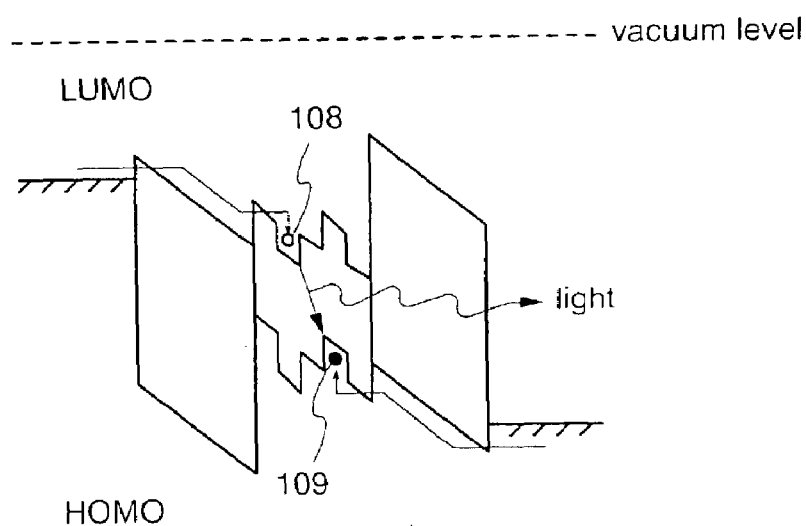

The structure of Embodiment 3 shown in FIG. 5A is characterized in that an electron trap region 501, a hole prevention region 502, a hole trap region 503, and an electron prevention region 504 are formed inside the emission layer 500. The hole prevention region 502 in this structure is a region serving as an electric potential barrier for preventing the hole 109 from moving to the side of the cathode 101. Further, the electron prevention region 504 is a region serving as an electric potential barrier for preventing the electron 108 from moving to the side of the anode 105.

In Embodiment 3, the electron trap region 501 and the hole prevention region 502 are made of the same organic material, and the hole trap region 503 and the electron prevention region 504 are made of the same organic material. The same organic material indicates an organic film or a cluster of organic substances. In the present invention, it is necessary to use an organic substance that has the effect of reducing the LUMO level and the HOMO level, and an organic substance that has the effect of raising the LUMO level and the HOMO level. At that point, the electron trap region 501 and the hole prevention region 502 are formed from the organic substance that has the effect of reducing the LUMO level and the HOMO level, and the hole trap region 503 and the electron prevention region 504 are formed from the organic substance that has the effect of raising the LUMO level and the HOMO level.

Note that although an example of providing the four regions, that is, the electron trap region 501, the hole prevention region 502, the hole trap region 503, and the electron prevention region 504 inside the emission layer 500 is shown in Embodiment 3, the structure may be a structure with the provision of either one, two, or three reunions. Of course, in case of two or three regions, the combination of regions is freely selected.

When adopting the structure of Embodiment 3, the carriers injected from the electrode are blocked by the prevention region and remains in the interior of the emission layer 500, whereby not only the probability of enclosing the carriers in the trap region but also the re-coupling efficiency ($\eta$ (re-coupling)) are improved. As a result, the driving voltage of the EL element is reduced. Thus, a reduction in the consumption power and an improvement in the reliability of the light-emitting device can be attained.

Embodiment 4

In Embodiment 4, an explanation will be made on a light-emitting device employing an EL element that has a band structure different from that of FIG. 1A with reference to FIGS. 6A and 6B. It is to be noted that an emission layer 600 is the only component in FIG. 6A that is different from FIG. 1A, and therefore the same reference symbols will be used for the other components.

Figure 6A:
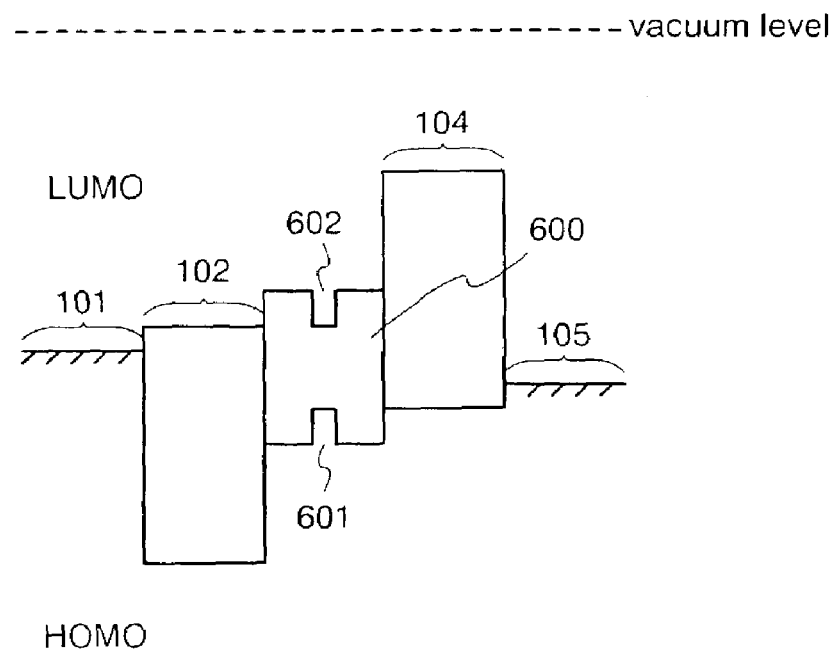
FIGS. 6A and 6B are diagrams showing a band structure of an EL element.
Figure 6B:
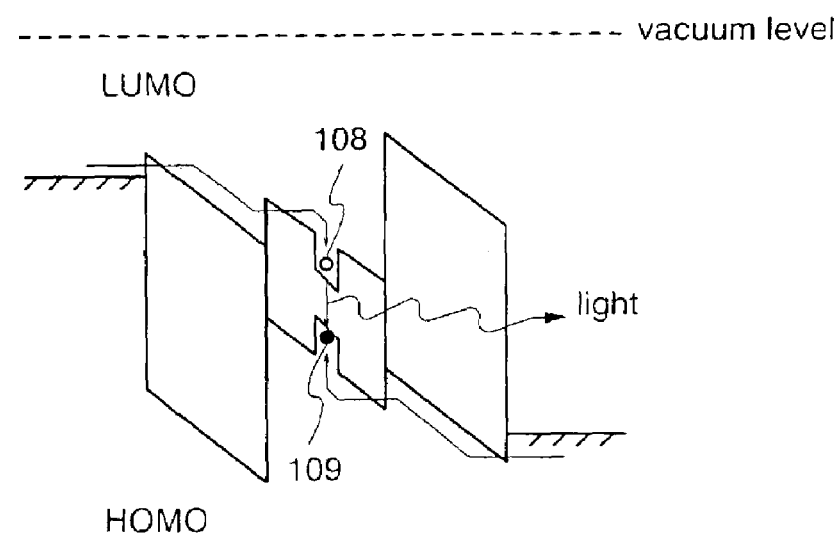

The structure of Embodiment 4 shown in FIG. 6A is characterized in that an electron trap region 601 and a hole trap region 602 are formed inside the emission layer 600 and that both the regions are formed of the same organic material. The same organic material indicates an organic film or a cluster of organic substances. However, in Embodiment 4, it is necessary to use an organic substance that has the effect of reducing the LUMO level and raising the HOMO level as well.

When adopting the structure of Embodiment 4, the carriers injected from the electrodes are enclosed in the trap regions formed on the same layer. However, because the band gap between the LUMO level and the HOMO level is extremely small in this case, the re-coupling efficiency ($\eta$ (re-coupling)) is improved. As a result, the driving voltage of the El element is reduced. Thus, a reduction in the consumption power and an improvement in the reliability of the light-emitting device can be attained.

Embodiment 5

An example of a light-emitting device of the present invention will be explained with reference to FIGS. 7A and 7B in Embodiment 5. Note that FIG. 7A is a cross-sectional view of the light-emitting device, and FIG. 7B is a top view thereof.

Figure 7A:
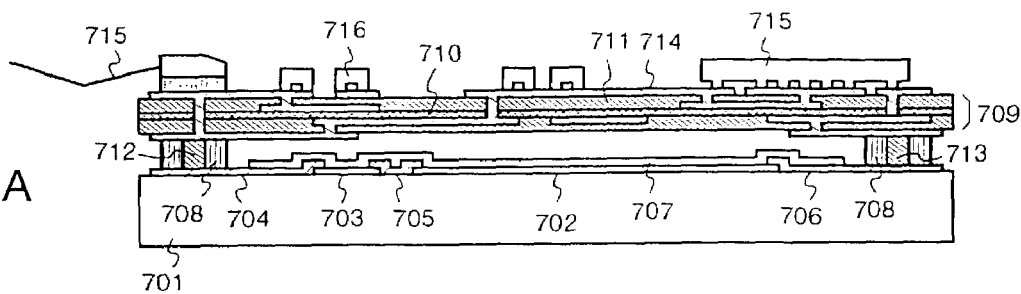
FIGS. 7A and 7B are diagrams showing a cross-sectional structure of an EL light-emitting device and a top structure thereof, respectively.
Figure 7B:
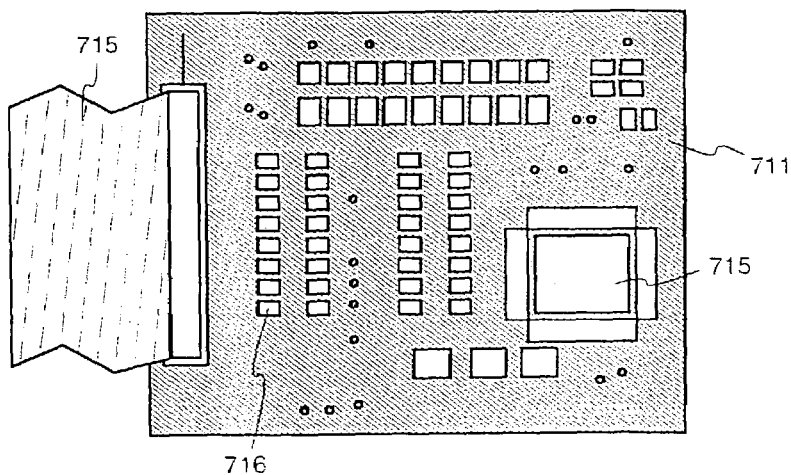

In FIG. 7A, reference symbol 701 denotes a substrate having a pixel portion 702 and a driver circuit 703 formed thereon. The pixel portion 702 and the driver circuit 703 can transfer electric signals through wirings 704 to 706. As long as the substrate 701 is transparent to visible radiation, the substrate may be made of any material.

In the pixel portion 702, a plurality of pixels containing TFTs and EL elements (typically pixels having a structure as shown in FIG. 3A) are formed in matrix, and a passivation film 707 is formed thereon. A tantalum oxide film that is formed by sputtering is used as the passivation film 707 in Embodiment 5. However, a silicon nitride film may be provided as long as it is possible to form the silicon nitride film at a temperature that will not cause deterioration of the organic EL film.

On top of the wirings 704 and 706, a sealing material 708 made of epoxy-based resin is formed so as to surround the pixel portion 702 and the driver circuit 703. A printed wiring board (PWB) 709 is bonded thereto by the sealing material 708. It is to be noted that typically, a piece of glass epoxy, an epoxy-based film, a piece of glass heat resistant epoxy, ceramic, alumina, paper based phenol or paper based epoxy can be used as a material of the printed wiring board 709. In addition, a glass substrate, a crystallized glass substrate, or a plastic substrate may be used. In Embodiment 5, a piece of glass epoxy-based substrate 711 sandwiching a ceramic 710 as a core material is employed as the printed wiring board.

At this point, conductors 712 and 713 made from an anisotropic conductive film (typically resin having metallic particles diffused therein) or a metal bump (typically a solder bump, a metal bump, a nickel bump, or a copper bump) are provided in the interior of the sealing material 708. Either the wiring 704 or the wiring 706 is electrically connected to a group of wiring 714 that is formed on the printed wiring board 709 via the conductors 712 and 713. Note that the group of wiring mentioned here is a generic term indicating wirings formed on the front surface, the back surface, or the interior of the printed wiring board 709.

The group of wiring 714 transmits the electric signals, which are transmitted to all FPC (flexible printed circuit) 715, to the conductors 712 and 713, and transmits electric signals between various kinds of ICs (integrated circuits) 715 and 716 that are connected on the printed wiring board 709. The group of wiring 714 is formed to a thickness of between 1 and 20 µm. A pattern made from typically a copper foil, a gold foil, a silver foil, a nickel foil, or an aluminum foil is used as the group of wiring 714.

In the light-emitting device of Embodiment 5 having a structure such as the above, the electric signals transmitted to the FPC 715 are processed by the printed wiring board 709. The processed electric signals are then transmitted to the pixel portion 702 or the driver circuit 703 via the conductors 712 and 713. In Embodiment 5 at this point, the printed wiring board 709 is a protection board for protecting the EL elements against external impact. In addition, the printed wiring board 709 may also be used as a substrate for enclosing the EL elements in a closed space.

Note that in Embodiment 5, although an IC is incorporated in the printed wiring board 709 in order that the printed wiring board 709 has a signal processing function, only the group of wiring may be formed and used as redundant wiring for reducing the resistance of the wirings used in the pixel portion 702 and the driver circuit 703. Thus, for example, a signal delay in the wiring supplying a current to the EL elements and in the Pate wiring of the TFTs can be improved.

Accordingly, the light-emitting device can be made high-performance and highly reliable by employing the printed wiring board as one of the substrates of the light-emitting device. It is to be noted that the constitution of Embodiment 5 may be implemented by combining it with any one of the constitutions of Embodiments 1 through 4.

Embodiment 6

In Embodiment 6, an explanation will be made on an organic EL film that can be used in the present invention. A characteristic of the present invention is in the provision of an organic film or a cluster of organic substances that can locally alter the LUMO level or the HOMO level in the interior of the emission layer. Any organic film that fulfills the above condition may be used. For example, an organic film that emits light via a triplet excitation can be used as the organic film or the cluster of organic substances in the interior of the emission layer.

To be more specific, materials such as Alq$_3$ (tris-6-quinolilite-aluminum complex). DPVBi (distylallylene conductor). BeBq2 (bisbenzoquinolilite berylliumis complex), TPD (triphenylamine conductor), α-NPD, PPV (polyparaphenylene vinylene), and PVK (polyvinyl carbazole) may be used as the emission layer. The molecular structures of the above-mentioned materials that can be used as the emission layer here are given in the following.

Chem 1

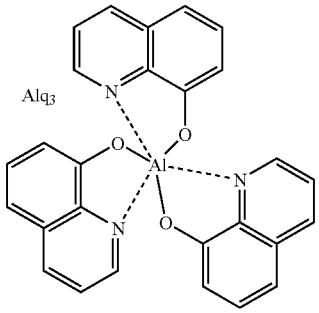

Chem 2

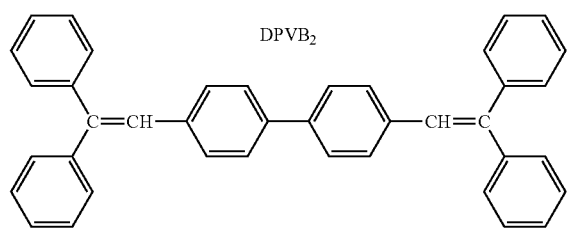

Chem 3

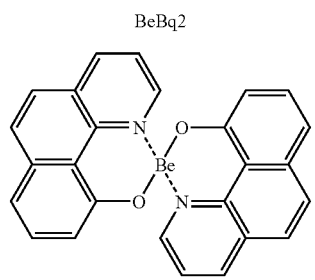

Chem 4

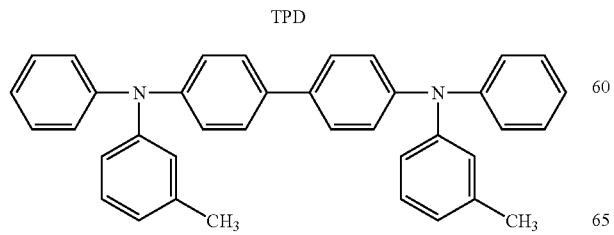

Chem 5

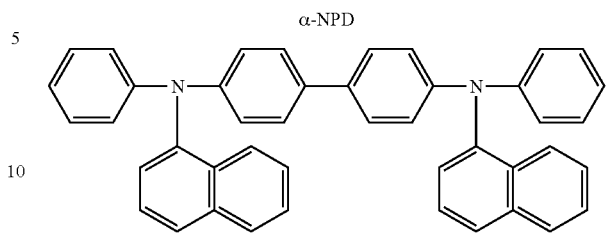

Chem 6

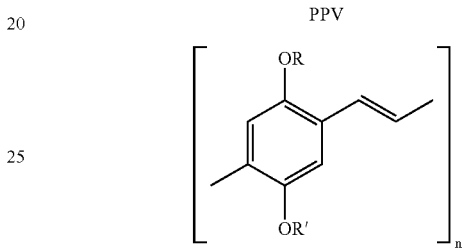

Chem 7

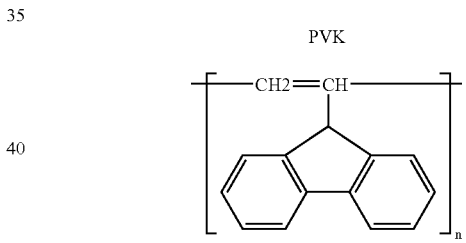

Further, specifically materials such as coumarin 6, DCM1, DCM2, quinacridon, rubrene, and perylene may be used as the fluorescent pigment. The molecular structures of the above-mentioned materials that can be used as the fluorescent pigment here are given in the following.

Chem 8

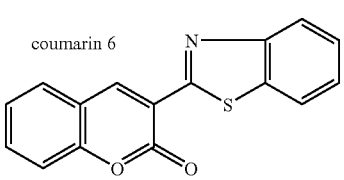

Chem 9

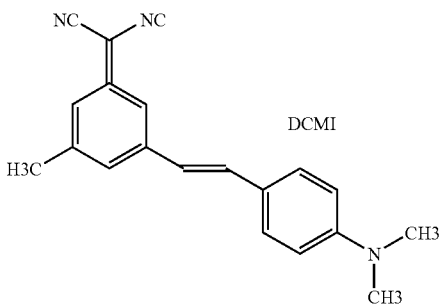

DCMI

Chem 10

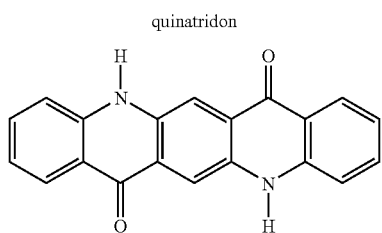

quinatridon

Chem 11

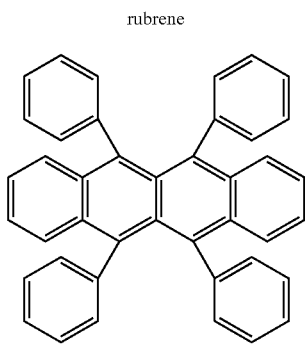

rubrene

Chem 12

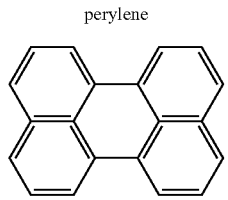

perylene

The band structure of the present invention may be formed by appropriately combining the above-mentioned emission layer and fluorescent substance. It is to be noted that the constitution of Embodiment 6 may be freely combined with any one of the constitutions of Embodiments 1 through 6.

Embodiment 7

The light-emitting device manufactured by implementing the present invention can be used as a display portion of various kinds of electric equipments. For instance, when appreciating a television broadcast or the like with a television equipped with a large screen, a display incorporating a light-emitting device of the present invention in a casing may be used as a display of 20 to 60 inch in diagonal. Note that a personal computer display a television broadcast receiving display, and a display for exhibiting all information such as a display for displaying announcements are included in the displays having the light-emitting device incorporated in a casing.

Further, the light-emitting device of the present invention may be used as the light source of a back light in a liquid crystal display incorporating a liquid crystal module (liquid crystal panel) in a casing. The light-emitting device of the present invention may also be used as the light source of a fluorescent display lamp or the like at a construction site. The liquid crystal display and the fluorescent display lamp are also electric equipments.

The light-emitting device of the present invention can further be used as a display portion for various kinds of electric equipments. The following can be given as other electric equipments according to the present invention: a video camera; a digital camera; a goggle type display (head mounted display); a navigation system; an audio playback device (typically, a car audio stereo or an audio component stereo); a notebook type personal computer; a game apparatus; a portable information terminal (typically, a mobile computer, a portable telephone, a portable game machine, or an electronic book); and an image playback device (typically, a device provided with a display portion which plays back images in a recording medium and displays the images). In particular, a wide angle of view is important for a portable information terminal often seen from an oblique angle, and therefore it is preferable to use the light-emitting device. Specific examples of these electric equipments are shown in FIGS. 8A to 9B.

Figure 8A:
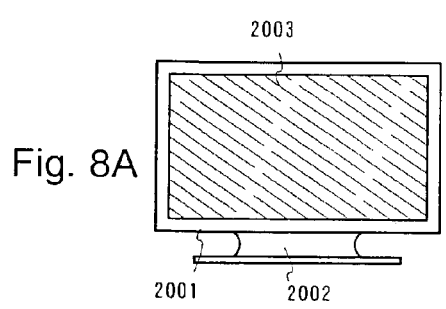
FIGS. 8A to 8F are diagrams showing examples of electric equipments.

FIG. 8A shows a display having a light-emitting device incorporated in a casing, and the display contains a casing 2001, a support stand 2002, a display portion 2003 and the like. The light-emitting device of the present invention can be used as the display portion 2003. Such a display is a self-emitting type so that a back light is not necessary. Thus, the display portion can be made thinner than that of a liquid crystal display.

Figure 8B:
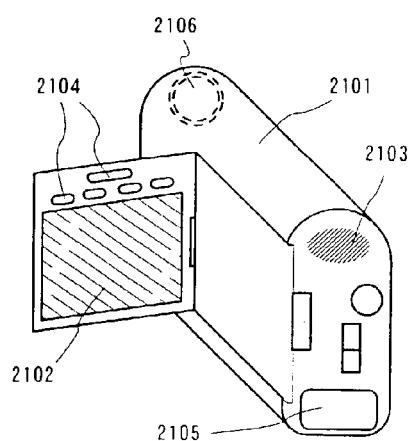

FIG. 8B shows a video camera, and contains a main body 2101, a display portion 2102, a sound input portion 2103, operation switches 2104, a battery 2105, an image receiving portion 2106 and the like. The light-emitting device of the present invention can be used as the display portion 2102.

Figure 8C:
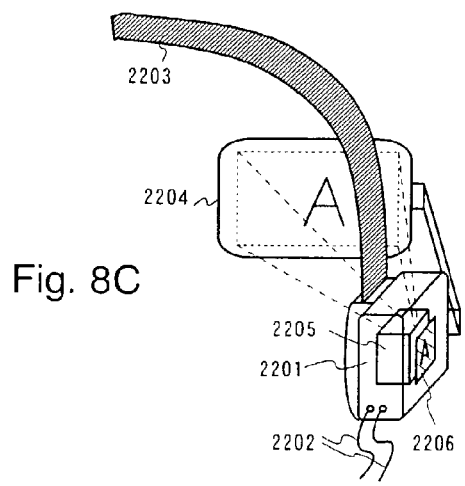

FIG. 8C is a portion (right side) of a head mounted EL display, and contains a main body 2201, a signal cable 2202, a head fixing band 2203, a display portion 2204, an optical system 2205, a light-emitting device 2206 and the like. The present invention can be applied to the light-emitting device 2206.

Figure 8D:
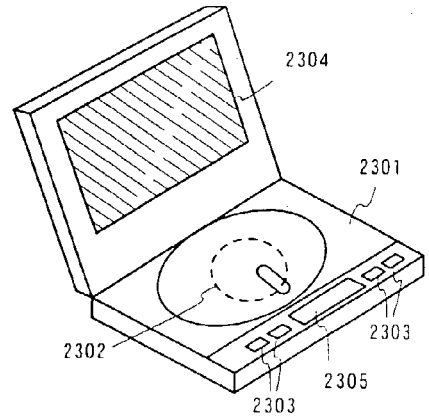

FIG. 8D is an image playback device equipped with a recording medium (specifically, a DVD playback device), and contains a main body 2301, a recording medium (such as a DVD) 2302, operation switches 2303, a display portion (a) 2304, a display portion (b) 2305 and the like. The display portion (a) 2304 is mainly used for displaying image information. The display portion (b) 2305 is mainly used for displaying character information. The light-emitting device of the present invention can be used as the display portion (a) 2304 and as the display portion (b) 2305. Note that the image playback device equipped with the recording medium includes devices such as household game machines.

Figure 8E:
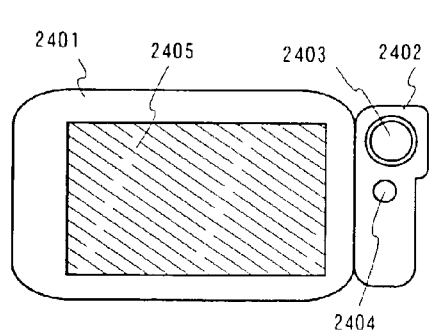

FIG. 8E shows a mobile computer, and contains a main body 2401, a camera portion 2402, an image receiving portion 2403, operation switches 2404, a display portion 2405 and the like. The light-emitting device of the present invention can be used as the display portion 2405.

Figure 8F:
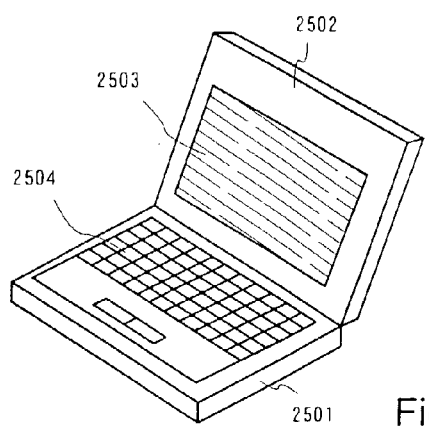

FIG. 8F is a personal computer, and contains a main body 2501, a casing 2502, a display portion 2503, a keyboard 2504 and the like. The light-emitting device of the present invention can be used as the display portion 2503.

Note that if the luminance increases in the future, then it will become possible to use the light-emitting device of the present invention in a front type or a real- type projector by expanding and projecting light containing output image information with a lens, an optical fiber or the like.

In addition, since the light-emitting device conserves power in the light emitting portion, it is preferable to display information so as to make the light emitting portion as small as possible. Consequently, when using the light-emitting device in a display portion mainly for character information, such as in a portable information terminal, in particular a portable telephone or an audio playback device, it is preferable to drive the light-emitting device so as to form character information by the light emitting portions while non-light emitting portions are set as background.

Figure 9A:
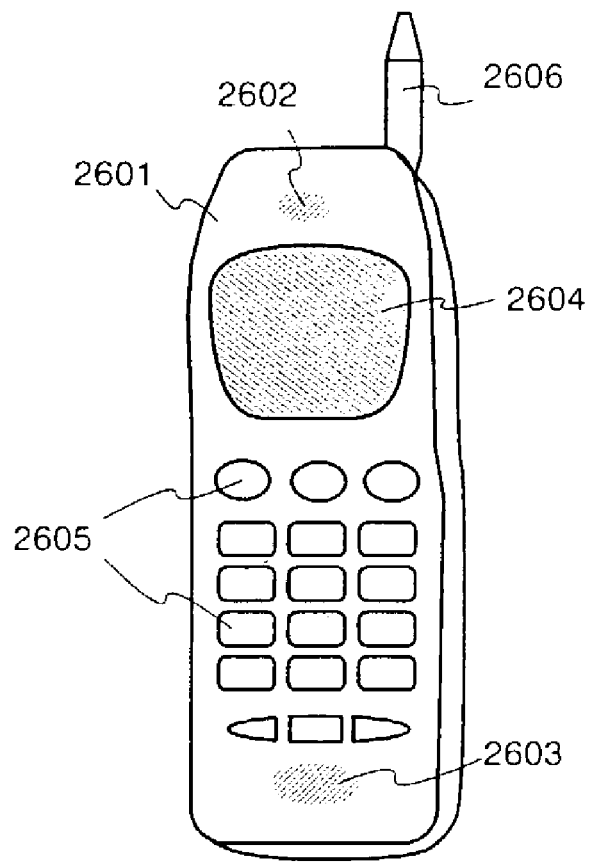
FIGS. 9A and 9B are diagrams showing examples of electric equipments.

FIG. 9A shows a portable telephone, and contains a main body 2601, a sound output portion 2602, a sound input portion 2603, a display portion 2604, operation switches 2605, and an antenna 2606. The light-emitting device of the present invention can be used as the display portion 2604. Note that by displaying white color characters in a black color background, the display portion 2604 can suppress the power consumption of the portable telephone.

Figure 9B:
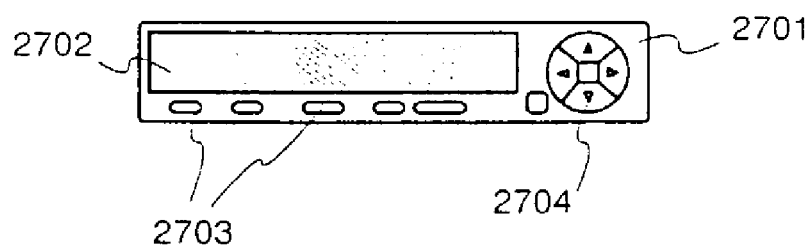

FIG. 9B shows an audio playback device, specifically a car audio stereo, and contains a main body 2701, a display portion 2702, and operation switches 2703 and 2704. The light-emitting device of the present invention can be used as the display portion 2702. Further, a car audio stereo is shown in Embodiment 7, but a portable type or a household audio playback device may also be used. Note that by displaying white color characters in a black color background, the display portion 2704 can suppress the power consumption. This is especially effective in a portable type audio playback device.

Thus, the application range of the present invention is extremely wide, whereby it may be employed in electric equipments of all fields. Further, the electric equipments of Embodiment 7 may employ the light-emitting device having any of the constitutions of Embodiments 1 through 5.

Embodiment 8

In the case of using electric equipment employing the light-emitting device of the present invention as its display portion outdoors, of course there are cases where the display portion is seen in a dark place and a bright place. At this point, even if the luminance thereof is not so high in the dark place, the display can be sufficiently recognized. However, there are cases where the display cannot be recognized if the luminance is not high in a bright place. In the case of the EL light-emitting device, the luminance changes in proportion to the amount of current operating the elements. Therefore, when the luminance is raised, the consumption power is also increased. However, if the emission luminance is adjusted to such a high level, an excessive bright display will be exhibited with only the increased consumption power in a dark place.

Preparing for such cases, it is effective to provide, in the light-emitting device or the electric equipment of the present invention, a sensor to sense the brightness outdoors such that the light-emitting device or the electric equipment has a function for adjusting the emission luminance in response to the level of the brightness that was sensed. In other words, the emission luminance is made high in a bright place and the emission luminance is made low in a dark place. As a result, together with preventing an increase in the consumption power, an EL light-emitting device that will not impart a feeling of fatigue to the observer can be realized.

Note that as a sensor for sensing the outdoor brightness, a CMOS sensor and a CCD (charge coupled device) can be used. The CMOS sensor can be formed integrally on the substrate that has the EL elements formed thereon by using a known technique, or an IC may be attached externally. Further, an IC having the CCD formed therein may be attached to the substrate having the EL elements formed thereon, or a structure may be such that the CCD or the CMOS sensor is provided in a part of the electric equipment using the EL light-emitting device as its display portion.

In response to the signals obtained through the sensor that senses the outdoor brightness, a control circuit for changing the amount of current operating the luminous elements is provided to thereby adjust the emission luminance of the EL elements in response to the outdoor brightness that was sensed. Note that such adjustments may be performed automatically or manually.

By applying Embodiment 8 to the EL light-emitting device or to the electric equipment of the present invention, it is possible to further reduce the consumption power of the EL light-emitting device. It is to be noted that Embodiment 8 may be implemented in any of the electric equipments shown in Embodiment 7.

Implementation of the present invention makes it possible to reduce the driving voltage of the EL elements, whereby the reduction in consumption power and the improvement in the reliability (longer life) of the light-emitting device can be attained. In addition, the consumption power of the electric equipment using the light-emitting device of the present invention as its display portion may be reduced.

What is claimed is:

1. A light emitting device comprising:
   a first electrode over a substrate;
   a first emission layer over the first electrode;
   a first cluster of organic substances in contact with the first emission layer;
   a second emission layer in contact with the first cluster of organic substances;
   a second cluster of organic substances in contact with the second emission layer;
   a third emission layer in contact with the second cluster of organic substances; and
   a second electrode over the third emission layer.

2. A light emitting device according to claim 1, wherein the first or second cluster of organic substances has a LUMO level that is lower than a LUMO level of the first, second and third emission layers.

3. A light emitting device according to claim 1, wherein the first or second cluster of organic substances has a HOMO level that is higher than a HOMO level of the first, second and third emission layers.

4. A light emitting device according to claim 1, wherein the light emitting device is used as a display portion of an electric equipment selected from group consisting of a video camera, a head mount EL display, a DVD playback device, a mobile computer, a portable telephone and a car audio stereo.

5. A light emitting device according to claim 1, wherein a shape of at least the first and second cluster of organic substances is a granular or a flat board-like shape.

6. A light emitting device comprising:
a thin film transistor over a substrate;
a first electrode over the thin film transistor;
a first emission layer over the first electrode;
a first cluster of organic substances in contact with the first emission layer;
a second emission layer in contact with the first cluster of organic substances;
a second cluster of organic substances in contact with the second emission layer;
a third emission layer in contact with the second cluster of organic substances; and
a second electrode over the third emission layer.

7. A light emitting device according to claim 6, wherein the first or second cluster of organic substances has a LUMO level that is lower than a LUMO level of the first, second and third emission layers.

8. A light emitting device according to claim 6, wherein the first or second cluster of organic substances has a HOMO level that is higher than a HOMO level of the first, second and third emission layers.

9. A light emitting device according to claim 6, wherein the light emitting device is used as a display portion of an electric equipment selected from group consisting of a video camera, a head mount EL display, a DVD playback device, a mobile computer, a portable telephone and a car audio stereo.

10. A light emitting device according to claim 6, wherein a shape of at least the first and second cluster of organic substances is a granular or a flat board-like shape.

11. A light emitting device comprising:
a thin film transistor over a substrate;
a passivation film over the thin film transistor;
a first electrode over the passivation film;
a first emission layer over the first electrode;
a first cluster of organic substances in contact with the first emission layer;
a second emission layer in contact with the first cluster of organic substances;
a second cluster of organic substances in contact with the second emission layer;
a third emission layer in contact with the second cluster of organic substances; and
a second electrode over the third emission layer.

12. A light emitting device according to claim 11, wherein the first or second cluster of organic substances has a LUMO level that is lower than a LUMO level of the first, second and third emission layers.

13. A light emitting device according to claim 11, wherein the first or second cluster of organic substances has a HOMO level that is higher than a HOMO level of the first, second and third emission layers.

14. A light emitting device according to claim 11, wherein the passivation film comprises tantalum oxide or silicon nitride.

15. A light emitting device according to claim 11, wherein the light emitting device is used as a display portion of an electric equipment selected from group consisting of a video camera, a head mount EL display, a DVD playback device, a mobile computer, a portable telephone and a car audio stereo.

16. A light emitting device according to claim 11, wherein a shape of at least the first and second cluster of organic substances is a granular or a flat board-like shape.

17. A light emitting device comprising:
a first electrode over a substrate;
a first emission layer over the first electrode;
a cluster of organic substances in contact with the first emission layer;
a second emission layer in contact with the first cluster of organic substances; and
a second electrode over the second emission layer.

18. A light emitting device according to claim 17, wherein the cluster of organic substances has a LUMO level that is lower than a LUMO level of the first and second emission layers.

19. A light emitting device according to claim 17, wherein the cluster of organic substances has a HOMO level that is higher than a HOMO level of the first and second emission layers.

20. A light emitting device according to claim 17, wherein a shape of the cluster of organic substances is a granular or a flat board-like shape.

21. A light emitting device comprising:
a thin film transistor over a substrate;
a first electrode over the thin film transistor;
a first emission layer over the first electrode;
a cluster of organic substances in contact with the first emission layer;
a second emission layer in contact with the first cluster of organic substances; and
a second electrode over the second emission layer.

22. A light emitting device according to claim 21, wherein the cluster of organic substances has a LUMO level that is lower than a LUMO level of the first and second emission layers.

23. A light emitting device according to claim 21, wherein the cluster of organic substances has a HOMO level that is higher than a HOMO level of the first and second emission layers.

24. A light emitting device according to claim 21, wherein a shape of the cluster of organic substances is a granular or a flat board-like shape.

25. A light emitting device comprising:
a thin film transistor over a substrate;
a passivation film over the thin film transistor;
a first electrode over the passivation film;
a first emission layer over the first electrode;
a cluster of organic substances in contact with the first emission layer;
a second emission layer in contact with the first cluster of organic substances; and
a second electrode over the second emission layer.

26. A light emitting device according to claim 25, wherein the cluster of organic substances has a LUMO level that is lower than a LUMO level of the first and second emission layers.

27. A light emitting device according to claim 25, wherein the cluster of organic substances has a HOMO level that is higher than a HOMO level of the first and second emission layers.

28. A light emitting device according to claim 25, wherein a shape of the cluster of organic substances is a granular or a flat board-like shape.

* * * * *